(12) United States Patent
Albertini et al.

(10) Patent No.: US 8,629,720 B2
(45) Date of Patent: Jan. 14, 2014

(54) DRIVING METHOD FOR OBTAINING A GAIN LINEAR VARIATION OF A TRANSCONDUCTANCE AMPLIFIER AND CORRESPONDING DRIVING CIRCUIT

(75) Inventors: Matteo Albertini, Cornaredo (IT); Daniele Ronchi, Maslianico (IT); Sandro Rossi, Pavia (IT); Giulio Ricotti, Broni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/482,714

(22) Filed: May 29, 2012

(65) Prior Publication Data

US 2012/0235744 A1    Sep. 20, 2012

Related U.S. Application Data

(63) Continuation-in-part of application No. PCT/EP2010/005928, filed on Sep. 29, 2010.

(30) Foreign Application Priority Data

Nov. 20, 2009   (IT) .......................... MI2009A002108

(51) Int. Cl.
*H03F 3/45*   (2006.01)
(52) U.S. Cl.
USPC ......................................... 330/254; 330/283
(58) Field of Classification Search
USPC ........................................ 330/253, 254, 283
See application file for complete search history.

(56) References Cited

U.S. PATENT DOCUMENTS

| 2006/0044064 A1 | 3/2006 | Pelleriti |
| 2008/0088374 A1 | 4/2008 | Hou et al. |
| 2008/0191803 A1 | 8/2008 | Lien et al. |
| 2009/0195236 A1 | 8/2009 | Hwu et al. |

OTHER PUBLICATIONS

Bollati, G. et al., "An Eighth-Order CMOS Low-Pass Filter with 30-120 MHz Tuning Range and Programmable Boost," IEEE Journal of Solid-State Circuits 36(7):1056-1066, Jul. 2001.

*Primary Examiner* — Robert Pascal
*Assistant Examiner* — Khiem Nguyen
(74) *Attorney, Agent, or Firm* — Seed IP Law Group PLLC

(57) ABSTRACT

The disclosure relates to a driving method for obtaining a linear gain variation of a transconductance amplifier that includes a first differential transistor cell, with adjustment of a driving voltage value of a degenerative driving transistor of the transconductance amplifier The method includes generating an output current signal of a second differential cell corresponding to the first differential transistor cell of the transconductance amplifier, the output current signal having a linear relationship with a transconductance value of the second differential cell as the driving voltage varies; generating a reference current signal having a linear relationship with a differential input voltage; comparing the output current signal and the reference current signal for adjusting the driving voltage value; and modifying the transconductance value of the second differential cell up to a balance of the current signals.

25 Claims, 7 Drawing Sheets

US 8,629,720 B2

DRIVING METHOD FOR OBTAINING A GAIN LINEAR VARIATION OF A TRANSCONDUCTANCE AMPLIFIER AND CORRESPONDING DRIVING CIRCUIT

BACKGROUND

1. Technical Field

The present disclosure relates to a driving method for obtaining a linear gain variation of a transconductance amplifier.

The disclosure further relates to a driving circuit for a transconductance amplifier of the type comprising at least one transistor differential cell and the following description is made with reference to the field of application only for simplifying the description thereof.

2. Description of the Related Art

As is well known, transconductance amplifiers are widely used to drive current, and are devices capable of receiving an input voltage and providing an output current substantially proportional to the received input voltage.

A transconductance amplifier typically comprises a differential pair, in particular of bipolar or field effect transistors (JFET, MOSFET), with mirror load and suitably biased.

A simplified diagram of a transconductance amplifier is shown in FIG. 1, globally indicated with reference numeral 1.

In particular, the amplifier 1 comprises a first T1 and a second transistor T2, in the example bipolar transistors, inserted between a mirror load block 2, in turn connected to a first voltage reference, in particular a positive supply VDD, and a biasing block 3, in turn connected to a second voltage reference, in particular a negative supply VSS.

More in particular, the first bipolar transistor T1 is inserted between a first mirror circuit node XS1 and a first degenerative circuit node XD1 and has a control terminal, or base, connected to an input terminal IN, whereas the second bipolar transistor T2 is inserted between a second mirror circuit node XS2 and a second degenerative circuit node XD2 and has a control terminal, or base, connected to a further voltage reference, in particular a ground GND, the second mirror circuit node XS2 being further connected to an output terminal OUT of the amplifier 1.

Moreover, the mirror load block 2 comprises a first mirror transistor MS1 inserted between the first positive supply voltage reference VDD and the first mirror circuit node XS1 and having a control terminal, or gate, diode-connected to the first mirror circuit node XS1 as well as to a control terminal, or gate, of a second mirror transistor MS2 inserted between the first positive supply voltage reference VDD and the second mirror circuit node XS2, that is, to the output terminal OUT of the amplifier 1.

Moreover, the biasing block 3 comprises a first biasing transistor MB1 inserted between the first degenerative circuit node XD1 and the second negative supply voltage reference VSS and having a control terminal, or gate, connected to a biasing terminal XB from which it receives a biasing voltage Vbias. The biasing block further includes a second biasing transistor MB2 inserted between the second degenerative circuit node XD2 and the second negative supply voltage reference VSS and having a control terminal, or gate, coupled to the gate of the first biasing transistor MB1. This biasing voltage Vbias imposes a desired current that flows in the biasing transistors, MB1 and MB2, and which depends on the type of application the amplifier 1 is intended for.

The amplifier 1 further comprises a degenerative resistance Rdeg inserted between the first and second degenerative circuit nodes, XD1 and XD2, as well as a degenerative driving transistor MD, inserted in parallel with the degenerative resistance Rdeg, between the first and second degenerative circuit nodes, XD1 and XD2, and having a control terminal, or gate, connected to a gate driving terminal XG and therefrom receiving a gate driving voltage Vtgc.

In particular, the degenerative driving transistor MD allows modifying the equivalent resistance or degenerative resistance of the amplifier 1 and varying the transconductance gain accordingly.

More in detail, when the degenerative driving transistor MD is powered, its resistance value Ron dominates relative to the degenerative resistance Rdeg, which is parallel thereto. In particular, the switch on resistance value Ron of the driving transistor MD is usually equal to $\frac{1}{100}$ of the value of the degenerative resistance Rdeg, the parallel connection thereof allowing to obtain a high transconductance gain for the amplifier 1 when the degenerative driving transistor MD is switched on. On the other hand, when the degenerative driving transistor MD is switched off, the degenerative resistance Rdeg dominates and establishes the transconductance gain of the amplifier 1.

However, while the amplifier structure as illustrated in FIG. 1 is controlled by the gate driving voltage Vtgc, which modifies the degenerative resistance thereof by modifying the equivalent resistance of the degenerative driving transistor MD, it exhibits a highly non-linear link between this gate driving voltage Vtgc and the transconductance gain gm of the amplifier 1. In fact, moving the gate driving voltage Vtgc linearly, the equivalent resistance of the degenerative driving transistor MD varies in a non-linear manner, and therefore there is an overall non-linear variation of the transconductance gain of the amplifier 1.

BRIEF SUMMARY

One embodiment of the present disclosure is a driving method for driving a transconductance amplifier, having such functional and structural features as to allow obtaining a linear link between a control voltage and the transconductance gain of the amplifier itself, thus overcoming the limits and the drawbacks that still affect the amplifiers made according to the known art.

One embodiment of the present disclosure provides a control loop for the control voltage to be applied to the degenerative transistor of the transconductance amplifier using a copy of the base differential cell of the amplifier itself for generating a current proportional to such transconductance whereby the non-linear variations of the transconductance gain of the amplifier itself are compensated.

One embodiment of the present disclosure is a driving method for obtaining a linear gain variation of a transconductance amplifier that includes at least one differential transistor cell by adjusting a driving voltage value of a degenerative driving transistor of said transconductance amplifier. The method includes:

generating an output current signal using a second differential cell that is substantially identical to the differential transistor cell of said transconductance amplifier, said output current signal having a linear relationship with a transconductance value of said second differential cell as said driving voltage varies;

generating a reference current signal having a linear relationship with a differential input voltage;

comparing said output current signal and said reference current signal and adjusting said driving voltage value and modifying said transconductance value of said second differential cell based on the comparing, to balance said current signals.

According to one embodiment of the present disclosure, said step of generating an output current signal using said second differential cell may comprise a step of offsetting a pair of transistors comprised therein.

One embodiment of the present disclosure is a transconductance system comprising a driving circuit connected to a transconductance amplifier that includes at least one differential transistor cell. The driving circuit comprises:

a second differential cell that is substantially identical to said differential cell of said transconductance amplifier and includes at least one first and one second transistor inserted between respective feedback circuit nodes of a feedback block in turn connected to a first voltage reference, and respective degenerative circuit nodes of a biasing block, in turn connected to a second voltage reference, a degenerative resistance and a degenerative driving transistor being inserted, in parallel to one another, between said degenerative circuit nodes, said degenerative driving transistor having a control terminal connected to a driving terminal; and a comparison block, inserted between said first and said second voltage reference and connected to said driving terminal, to which it provides a controlled driving voltage value said differential cell providing an output current value on said driving terminal being proportional to a transconductance value thereof and said comparison block providing a reference current value on said driving terminal having a linear relationship with an input voltage to said comparison block.

More in particular, the disclosure comprises the following additional and optional features, taken individually or in combination as needed.

According to one embodiment of the present disclosure, the driving circuit may further comprise an output transistor being inserted between said first voltage reference and said driving terminal and connected to a first feedback circuit node.

According to one embodiment of the present disclosure, said feedback block may comprise at least one first and one second feedback transistor, inserted between said first voltage reference and said feedback circuit nodes, respectively, said second feedback transistor being diode-connected and said first feedback transistor having a control terminal connected to a control terminal of said output transistor.

According to one embodiment of the present disclosure, said comparison block may comprise:

a differential pair of transistors, being inserted between an internal biasing node and respective first and second internal mirror nodes and having respective control terminals connected to a pair of differential inputs; as well as a plurality of mirror transistors respectively connected to said first and second internal mirror nodes and to said driving terminal, as well as to said second voltage reference.

According to one embodiment of the present disclosure, said plurality of mirror transistors may comprise at least:

a first mirror transistor inserted between said second internal mirror node and said second voltage reference, being diode-configured and having a control terminal connected to said second internal mirror node;

a second mirror transistor, in turn inserted between said driving terminal and said second voltage reference and having a control terminal connected to said control terminal of said first mirror transistor; as well as a third mirror transistor being inserted between said first internal mirror node and said second voltage reference and diode-configured with its control terminal connected to said first internal mirror node.

Moreover, according to one embodiment of the present disclosure, said comparison block may further comprise a biasing transistor inserted between said first voltage reference and said internal biasing node and having a control terminal connected to a further biasing terminal from which it receives a further biasing voltage.

In particular, according to one embodiment of the present disclosure, said differential pair of transistors may comprise P-channel MOS transistors, and said plurality of mirror transistors may comprise N-channel MOS transistors.

Moreover, the biasing transistor may be a P-channel MOS transistor.

According to one embodiment of the present disclosure, said differential pair of transistors may provide a mirror current to said first mirror transistor according to the relation:

$$Is = gm_{in} * (VINp - VINn)$$

where:

Is is a value of said mirror current;

$gm_{in}$ is a transconductance value of said differential pair of transistors; and VINp−VINn is a differential voltage value being applied to said pair of differential inputs.

According to one embodiment of the present disclosure, a reference current flows in said second mirror transistor being proportional to said mirror current, according to a mirror ratio of said first and second mirror transistors.

Moreover, according to one embodiment of the present disclosure, said first and second transistors of said copy differential cell may be offset.

According to one embodiment of the present disclosure, said first bipolar transistor may have a control terminal connected to a further voltage reference and said second transistor may have a control terminal connected to a voltage block, in turn connected to said further voltage reference and suitable for providing a constant voltage signal to said control terminal capable of offsetting said first and second transistors of said copy differential cell.

According to one embodiment of the present disclosure, said first and second transistors of said copy differential cell may have control terminals connected to a further voltage reference and be offset in terms of area.

According to one embodiment of the present disclosure, said biasing block may comprise a first and a second biasing transistors being respectively inserted between said degenerative circuit nodes and said second voltage reference and having control terminals connected to one another and to a biasing terminal from which they receive a biasing voltage.

According to one embodiment of the disclosure, said differential transistor cell of said transconductance amplifier may comprise transistors selected from bipolar and field effect transistors, preferably bipolar, and said first and second transistors of said copy differential cell may be transistors selected from bipolar and field effect transistors, preferably bipolar.

According to one embodiment of the disclosure, said comparison block may comprise an input current generator controlled by a differential input voltage and connected to a first feedback circuit node by at least one operational amplifier in turn having an output terminal connected to said driving terminal.

According to one embodiment of the disclosure, the driving circuit may further comprise a first and a second resistive element inserted between said first supply voltage reference and respective first and second input terminals of said operational amplifier, said second input terminal being further connected to said first feedback circuit node.

Moreover, according to one embodiment of the disclosure, said feedback block may comprise a first feedback transistor, being inserted between said first supply voltage reference and said first feedback circuit node and having a control terminal connected to a control terminal of a second feedback transistor, being diode-connected and in turn inserted between said first supply voltage reference and a second feedback circuit node.

According to one embodiment of the disclosure, said biasing block may further comprise a first and a second biasing current generator being inserted between said first and second degenerative circuit nodes, respectively, and said second voltage reference.

Finally, according to one embodiment of the disclosure, the driving circuit may further comprise a voltage buffer being inserted between said driving node and a plurality of differential transistor cells of transconductance amplifiers to be driven.

The features and the advantages of the driving method and transconductance system according to the disclosure will appear more clearly from the following description of an embodiment thereof, made by way of an indicative non-limiting example with reference to the annexed drawings.

DETAILED DESCRIPTION

Figure 1:
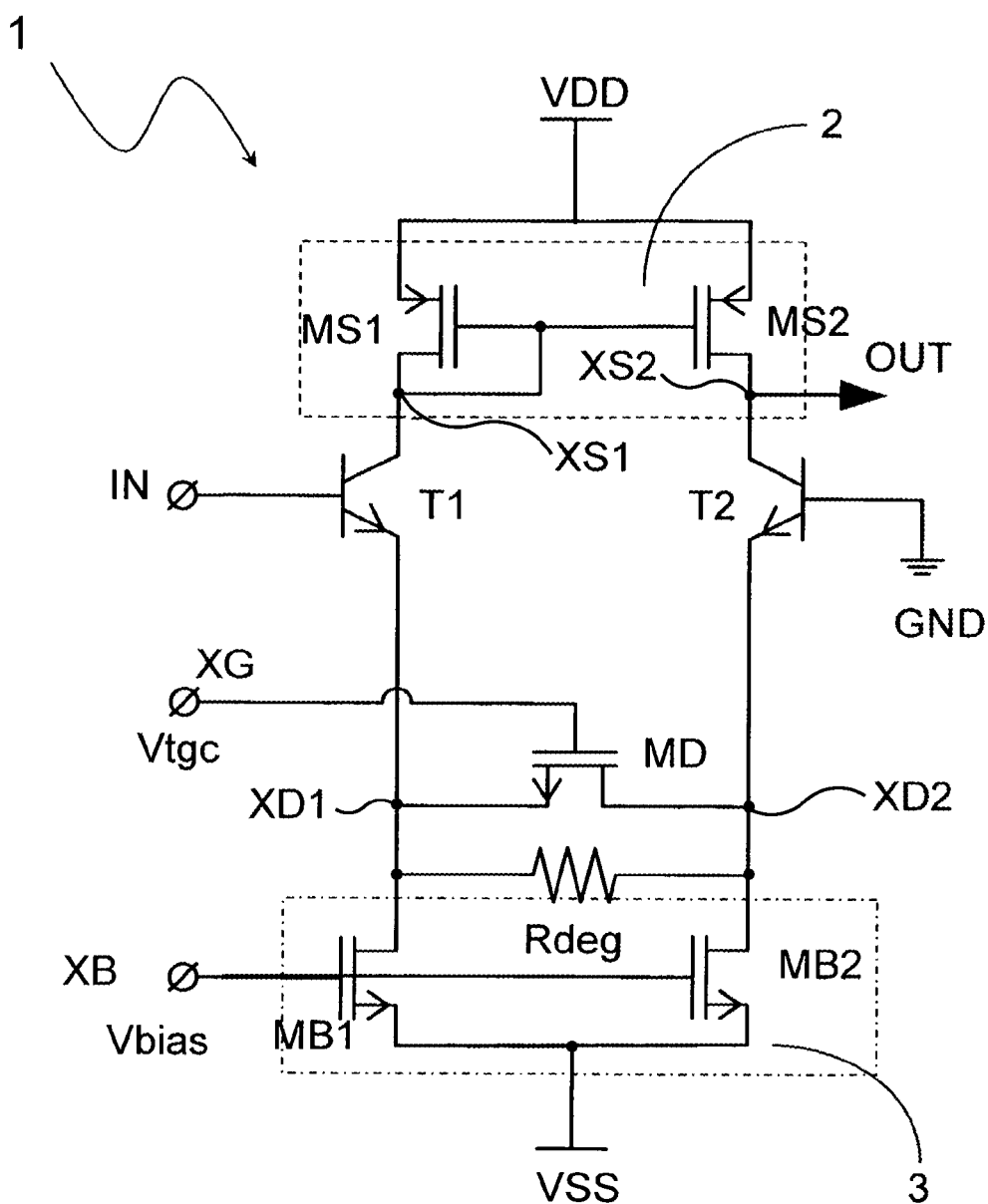
FIG. 1 schematically shows a transconductance amplifier realised according to the prior art.

With reference to such figures, reference numeral 10 globally and schematically indicates a driving circuit connected to a transconductance amplifier, such as the transconductance amplifier 1, in a transconductance system according to the disclosure.

Figure 5:
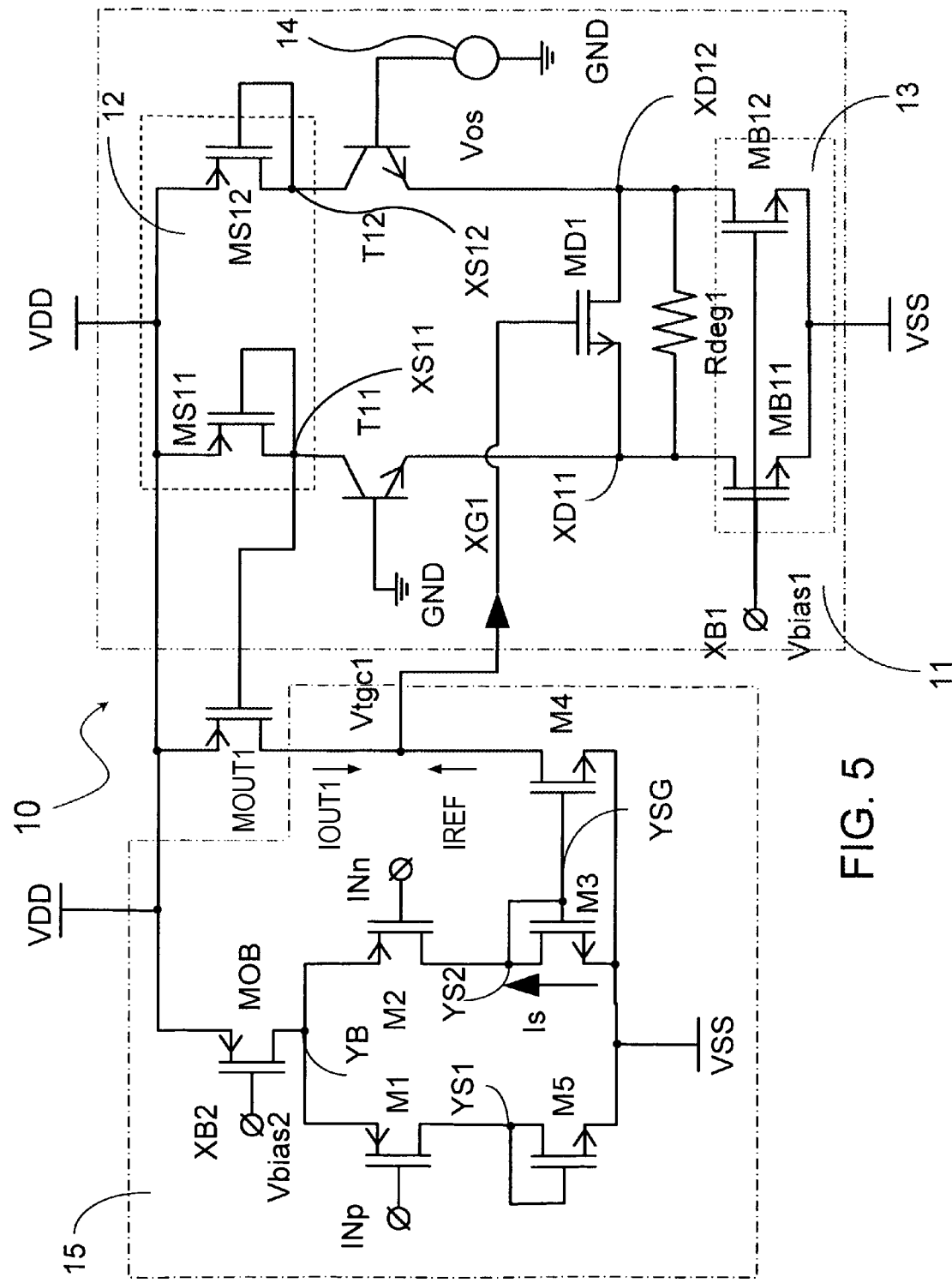
FIG. 5 schematically shows the driving circuit according to the disclosure.

Generic embodiments of the driving circuit 10 according to the disclosure are illustrated with reference to FIGS. 2 and 3, and a specific embodiment of the circuit 10 is illustrated in FIG. 5.

This circuit is suitable for implementing a driving method for obtaining a linear gain variation of a transconductance amplifier, by adjusting a driving voltage value Vtgc1 of a degenerative driving transistor MD of said transconductance amplifier 1, which includes at least one differential transistor cell 11.

In particular, the method according to one embodiment of the disclosure comprises the steps of:
  generating an output current signal Iout1 of a differential cell 11 that is substantially identical to the differential transistor cell 11 of the transconductance amplifier 1, this output current signal Iout1 having a linear relationship with a transconductance value gm1 of the differential cell 11 as the driving voltage Vtgc1 varies;
  generating a reference current signal Iref having a linear relationship with a differential input voltage;
  comparing the output current signal Iout1 and the reference current signal Iref and adjusting the driving voltage value Vtgc1 and modifying the transconductance value gm1 of the differential cell 11 based on the comparing until said current signals Iout1 and Iref are balanced.

According to an embodiment of the disclosure, the step of generating an output current signal Iout1 of the differential cell 11 comprises offsetting the pair of transistors comprised in the differential cell 11.

Figure 2:
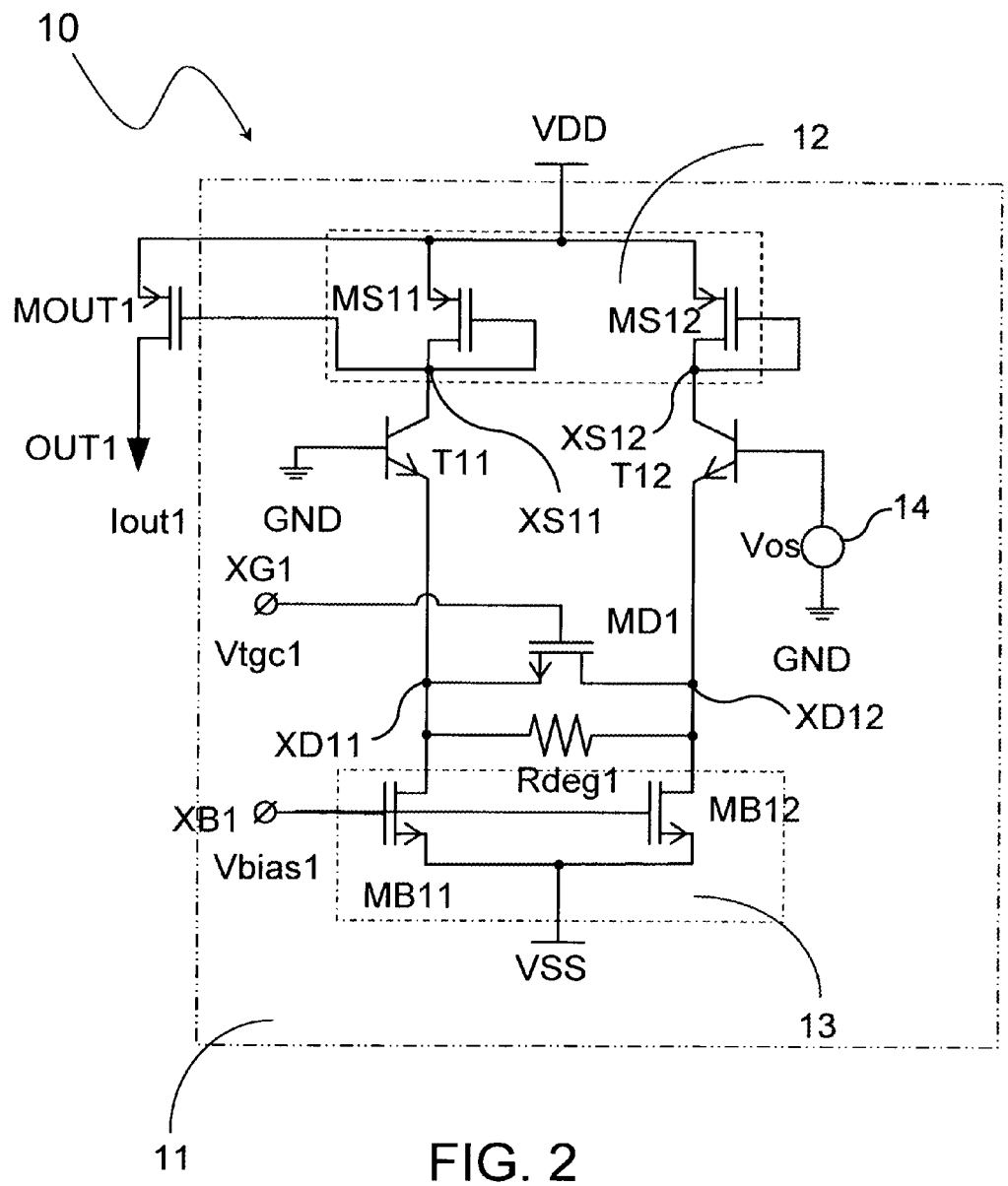
FIGS. 2 and 3 schematically show the working principle of a driving circuit connected to a transconductance amplifier in a transconductance system realised according to the disclosure.
Figure 3:
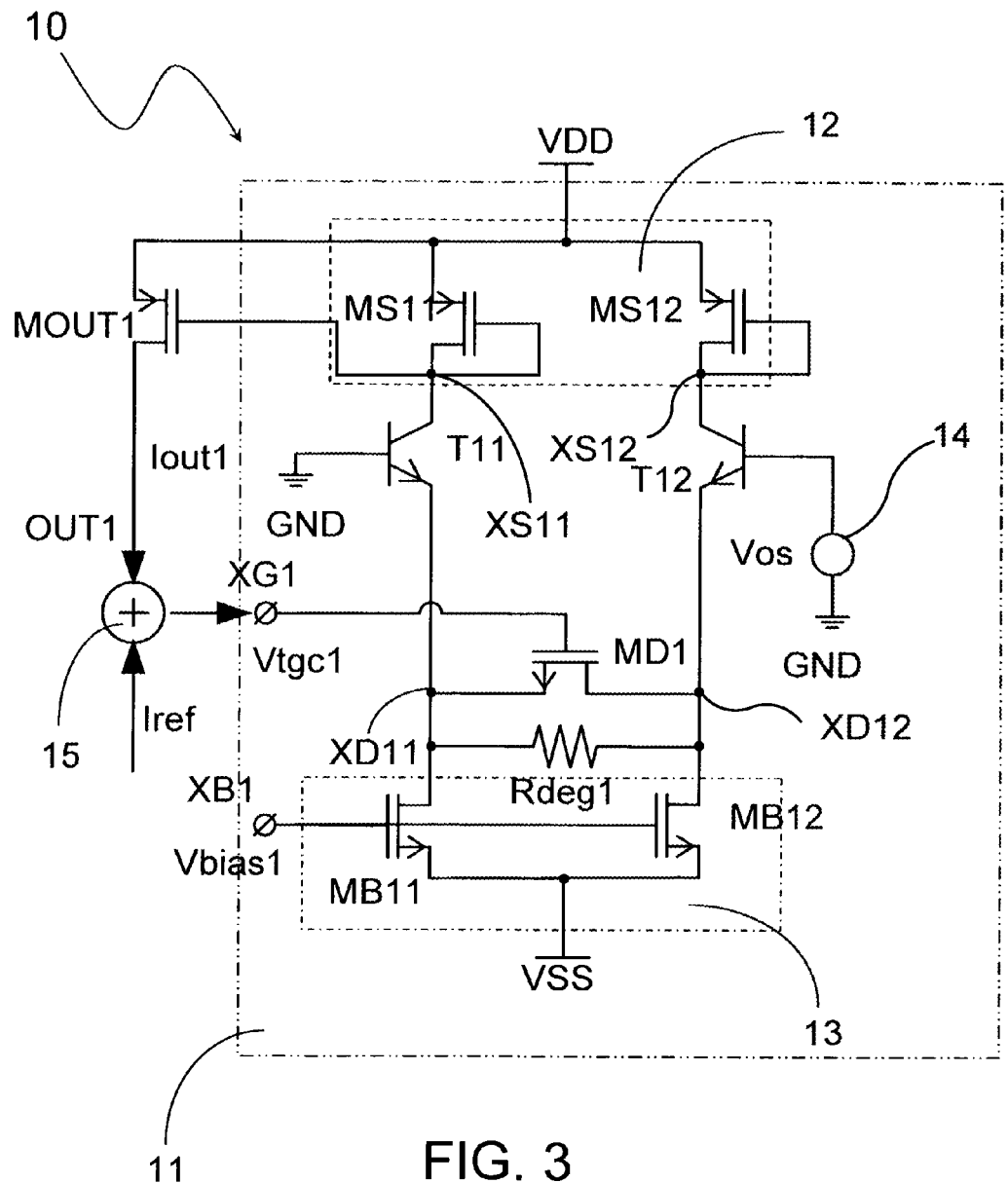

In particular, as shown in FIGS. 2, 3 and 5, the driving circuit 10 suitable for implementing this method comprises the differential cell 11 which is substantially identical to the base structure of a transconductance amplifier of a transconductance system that includes the driving circuit 10 connected to the transconductance amplifier, such as the amplifier 1 which includes the differential bipolar transistor cell 11.

In particular, the differential cell 11 comprises a first T1 and a second transistor T2, which are selected from bipolar or field effect transistors, in the example of the figure bipolar transistors, electrically coupled between a feedback block 12, in turn connected to a first voltage reference terminal, in particular a terminal that receives a positive supply VDD, and a biasing block 13, in turn connected to a second voltage reference terminal, in particular a terminal that receives a negative supply VSS.

More in particular, the first bipolar transistor T1 is electrically coupled between a first feedback circuit node XS11 and a first degenerative circuit node XD11 and has a control terminal, or base, being connected to a further voltage reference terminal, in particular a ground terminal GND, whereas the second bipolar transistor T12 is electrically coupled between a second feedback circuit node XS12 and a second degenerative circuit node XD12 and has a control terminal, or base, connected to a voltage block 14, whose the purpose shall be clarified hereinafter. The voltage block 14 is in turn connected to ground GND and is suitable for providing a constant voltage signal Vos to the control terminal, or base, of the second bipolar transistor T12.

Moreover, the feedback block 12 comprises a first feedback transistor MS11 electrically coupled between the first positive supply voltage reference VDD and the first feedback circuit node XS11 and a second feedback transistor MS12 electrically coupled between the first positive supply voltage reference VDD and the second feedback circuit node XS12.

Moreover, the biasing block 13 comprises a first biasing transistor MB11, electrically coupled between the first degenerative circuit node XD11 and the second negative supply voltage reference VSS and having a control terminal, or gate, connected to a biasing terminal XB1 from which it receives a biasing voltage Vbias1, as well as to a control terminal, or gate, of a second biasing transistor MB12, in turn electrically coupled between the second degenerative circuit node XD12 and the second voltage reference terminal VSS.

The differential cell 11 further comprises a degenerative resistance Rdeg1, electrically coupled between the first and second degenerative circuit nodes, XD11 and XD12, as well as a degenerative driving transistor MD1 electrically coupled in parallel with the degenerative resistance Rdeg1 between the first and second degenerative circuit nodes XD11 and XD12, and having a control terminal, or gate, connected to driving terminal XG1, in particular a gate driving terminal XG1 and therefrom receiving a driving voltage Vtgc1, in particular a gate driving voltage Vtgc1.

According to a further embodiment of the disclosure, the second feedback transistor MS12 is diode-connected and has a control terminal, or gate, connected to the second feedback circuit node XS12, whereas the first feedback transistor MS11 has a control terminal, or gate, connected to a further output transistor MOUT1, in turn electrically coupled between the first positive supply voltage reference VDD and an output terminal OUT1, as shown in FIG. 2.

On the output terminal OUT1, the driving circuit 10 provides a current value Iout1 that is proportional to the transconductance value gm of the differential cell 11 according to the relationship:

$$Iout1 = gm * Vos,$$

Vos being the constant voltage value provided by the voltage block 14 to the base terminal of the second bipolar transistor T12.

In substance, the configuration of the driving circuit 10 which comprises the differential cell 11 allows to obtain, as the gate driving voltage Vtgc1 gate applied to the gate terminal of the degenerative driving transistor MD1 varies, an output current value Iout1 having a linear relationship with the transconductance gm of the differential cell 11 itself. In particular, the diode-configuration of the second feedback transistor MS 12 and a suitable offset of the differential pair of bipolar transistors T11 and T12, in particular thanks to the constant voltage signal Vos provided by the voltage block 14, allow the driving circuit to provide the output current value Iout1 to vary linearly with the transconductance gm of the differential cell 11.

According to an embodiment of the disclosure, the driving circuit 10 further comprises, as shown in FIG. 3, a comparison block 15 configured to compare the output current value Iout provided on the output terminal OUT1 by the output transistor MOUT1 with a reference current Iref. This reference current Iref suitably exhibits a linear relationship with a differential input voltage applied to the comparison block 15, as shall be explained hereinafter. The result of this comparison drives the gate driving terminal XG1 with a controlled driving voltage Vtgc1.

In fact, thanks to the arrangement of the driving circuit 10, a variation of the reference current Iref makes the controlled driving voltage Vtgc1 modify the transconductance value gm1 of the differential cell 11, at least until currents are balanced, that is, until the following relationship is satisfied:

$$gm1 * Vos = Iout1 = Iref.$$

It should be underlined that, irrespective of the relationship between driving voltage Vtgc1 and transconductance gm, the differential cell 11 allows to obtain a linear dependence of the transconductance gain of the driving circuit 10 from the reference current Iref thanks to the control loop made by the feedback block 12, the output transistor MOUT1, and the comparison block 15.

In particular, the comparison block 15 is configured to generate a reference current Iref having a linear dependence from an input signal.

In a simple form according to one embodiment, the driving circuit 10 comprises:

the differential cell 11 which is substantially identical to the differential cell of said transconductance amplifier which it is intended to drive and includes first and second transistors T11 and T12 electrically coupled between the feedback circuit nodes XS11 and XS12 of the feedback block 12 and respective degenerative circuit nodes XD11 and XD12 of the biasing block 13, a degenerative resistance Rdeg1, and a degenerative driving transistor MD1 electrically coupled in parallel to the degenerative resistance Rdeg1 between the degenerative circuit nodes XD11 and XD12, the degenerative driving transistor MD1 having a control terminal connected to the driving terminal XG1; and the comparison block 15, which is electrically coupled between the first and second voltage reference terminals VDD and VSS, and to the driving terminal XG1, to which it provides a controlled driving voltage value Vtgc1.

According to one embodiment of the disclosure, the differential cell 11 provides an output current value Iout1 on the driving terminal XG1 that is proportional to its transconductance value gm1. Moreover, the comparison block 15 provides the reference current value Iref on the driving terminal XG1 having a linear relationship with the input voltage to the comparison block 15 itself.

Figure 4:
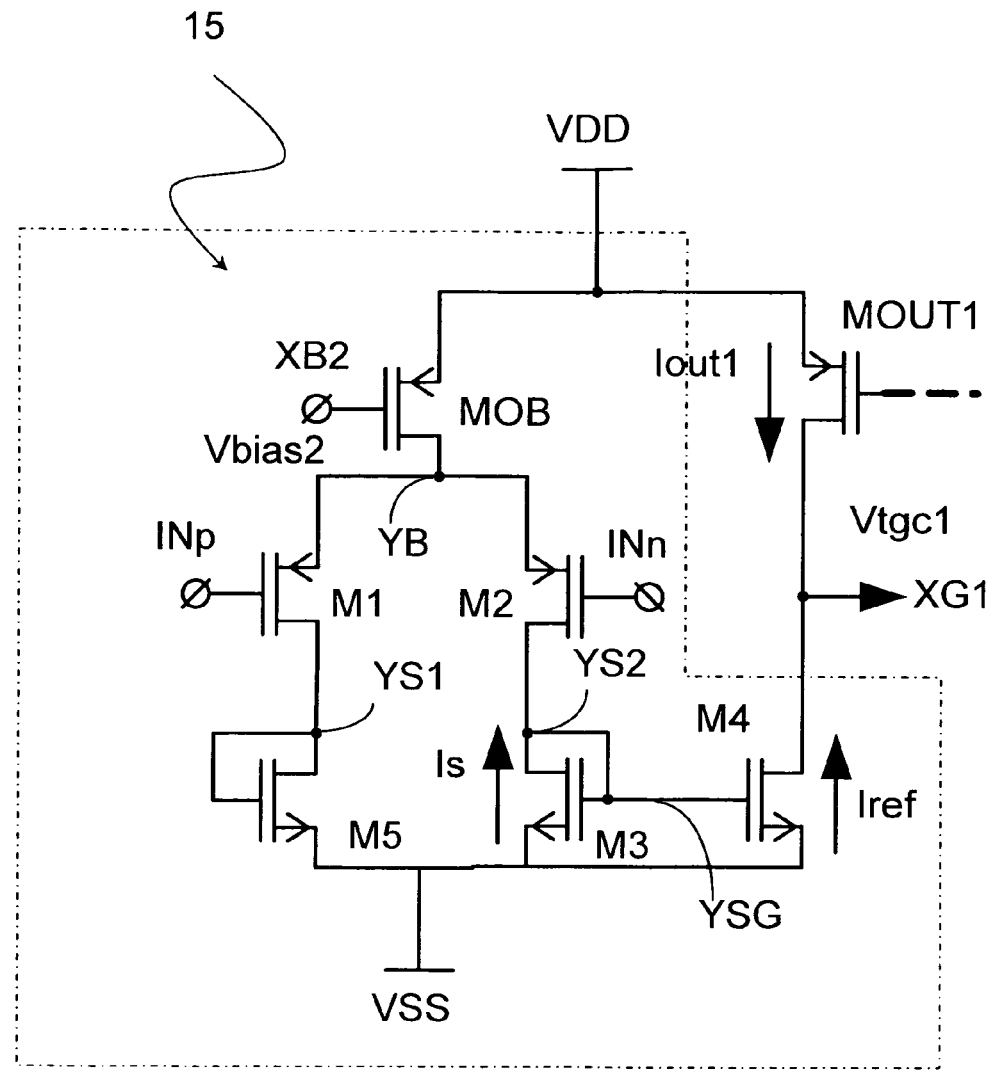
FIG. 4 schematically shows a reference current generator for the driving circuit according to the disclosure.

A preferred embodiment of this comparison block 15 is schematically shown in FIG. 4. The comparison block 15 in particular comprises a first differential pair of transistors M1 and M2, in the example P-channel MOS transistors, electrically coupled between an internal biasing node YB and respective first and second internal mirror nodes YS1, YS2 and having respective control terminals or gates connected to a pair of differential inputs INp and INn of the comparison block 15 itself The internal biasing node YB is further connected to the first voltage reference terminal VDD through a further biasing transistor MOB, in the example a P-channel MOS transistor, having a control terminal, or gate, connected to a further biasing terminal XB2 from which it receives a further biasing voltage Vbias2. In particular, the further biasing voltage Vbias2 imposes a current that flows in the further biasing transistor MOB and splits into the first differential pair of transistors M1 and M2.

The comparison block 15 further comprises a plurality of mirror transistors, in particular a first M3, a second M4, and a third mirror transistor M5, in the example N-channel MOS transistors.

The first mirror transistor M3 is electrically coupled between the second internal mirror node YS2 and the second voltage reference terminal VSS, is diode-configured, and has a control terminal, or gate, connected to the second internal mirror node YS2 as well as to a control terminal, or gate, of the second mirror transistor M4, in turn electrically coupled between the gate driving terminal XG1 and the second voltage reference terminal VSS.

Moreover, the third mirror transistor M5 is electrically coupled between the first internal mirror node YS1 and the second voltage reference terminal VSS and is diode-configured with its control terminal, or gate, connected to the first internal mirror node YS1.

In particular, in the case of differential input voltages, VINp and VINn, on the input terminals INp and INn, the differential pair of transistors M1 and M2 provides a mirror current Is to the first mirror transistor M3 according to the relationship:

$$Is = gm_{in} * (VINp - VINn),$$

$gm_{in}$ being the transconductance value of the differential cell formed by the differential transistors M1 and M2.

A reference current Iref is thus obtained which flows in the second mirror transistor M4 and is proportional to the mirror current Is, according to the mirror relationship of transistors M3 and M4. An input current is used for the differential pair of transistors M1 and M2 that is unrelated to the output current Iout of the differential cell 11 of the driving circuit 10, the reference current Iref being directly proportional (or linear relative) to the differential input voltage VINp−VINn.

The driving circuit 10 thus obtained is illustrated in FIG. 5.

The driving circuit 10 in particular comprises the differential cell 11 and the comparison block 15 illustrated before with reference to FIGS. 2, 3 and 4.

It is noted that the driving circuit 10 compares currents Iout and Iref in the driving terminal XG1, corresponding to the output terminal OUT1, thanks to the connection in series of the output transistor MOUT1 of the differential cell 11 and of the second mirror transistor M4 of the comparison block 15, without the need of using an operational amplifier, working directly in current.

In particular, it is immediate to verify that when the output current Iout increases, the gate driving terminal XG voltage increases which adjusts the differential cell 11, and the reference current Iref through the second mirror transistor M4 of the comparison block 15 also increases until Iout=Iref.

It should be noted that for the differential cell 11 to work properly it is sufficient to use a constant voltage signal Vos, having a width of few millivolts, as provided by the voltage block 14 and applied to the control terminal, or base, of the second bipolar transistor T12 to offset the bipolar transistors of the differential cell 11.

Figure 6:
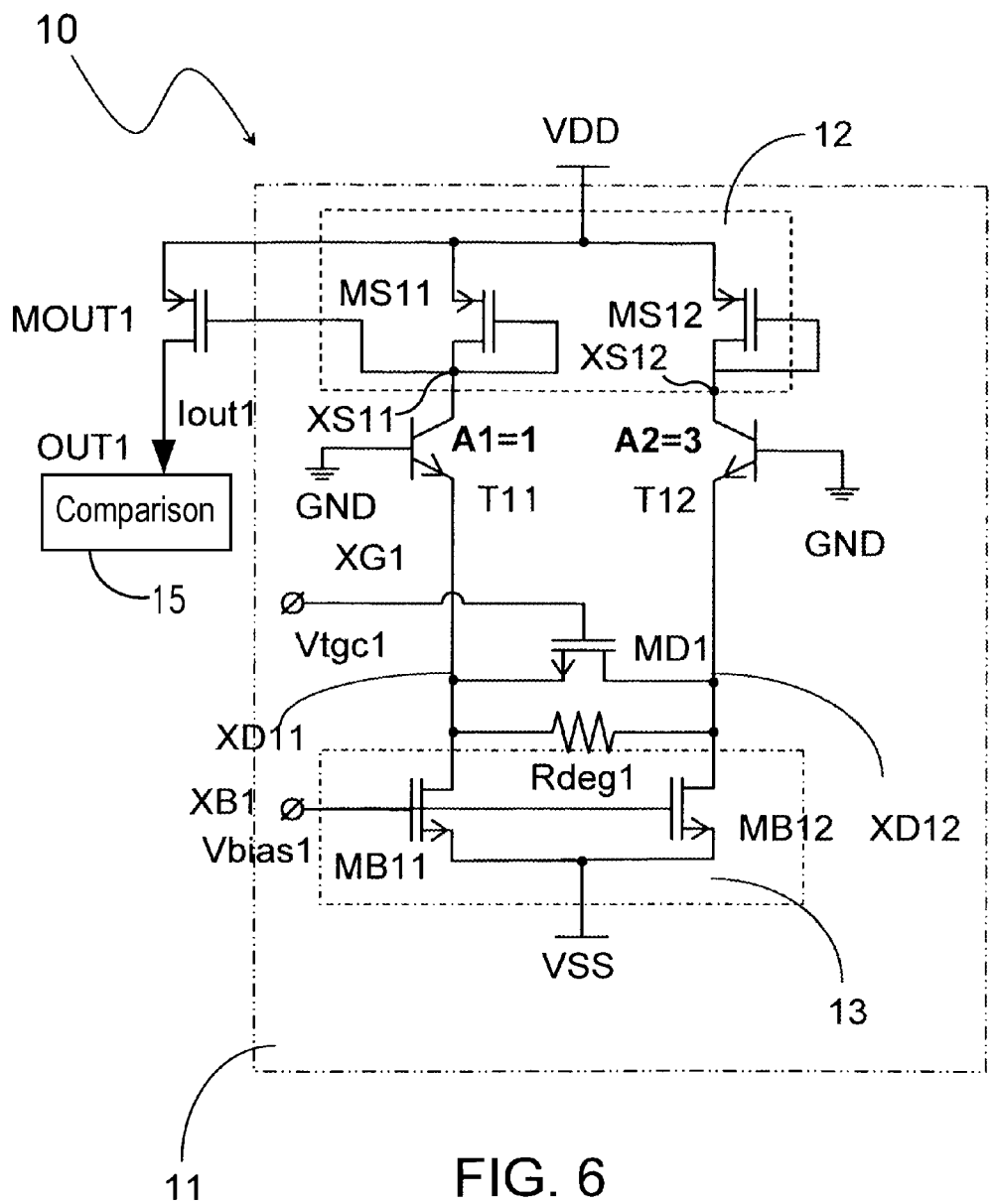
FIG. 6 schematically shows an alternative embodiment of the driving circuit according to the disclosure.

In an alternative embodiment, it is possible to ensure the proper working of the differential cell 11 without the use of the voltage block 14. In this case, the bipolar transistors T11 and T12 of the differential cell 11 are suitably offset in terms of area, A1 and A2 respectively. In particular, as indicated in FIG. 6, the second bipolar transistor T12 is sized so as to have an area A2 three times larger than an area A1 of the first bipolar transistor T11.

This configuration of the differential cell 11 allows keeping the transconductance gm of the pair of bipolar transistors unchanged since:

$$gm = I_c/V_T,$$

wherein:

$V_T$ is the thermal voltage equal to kT/q, where k is the Boltzmann constant, T temperature in Kelvin and q the electron charge; and $I_C$ is the biasing current that flows in the collector terminals of the first and second bipolar transistors T11 and T12.

The differential cell 11 also allows a voltage difference for each bipolar transistor T11, T12 equal to:

$$V_{BE} = V_T * \ln(I_C/I_{SAT}).$$

where:

$V_{BE}$ is the voltage difference between the base and emitter terminals of the bipolar transistor;

$V_T$ is the thermal voltage; and $I_{SAT}$ is the saturation current of the transistor that depends on the area of the transistor itself.

The area offset of the bipolar transistors T11 and T12 causes a difference between their base-emitter voltages. In this way, since the control terminals, or base, of these transistors are connected to ground GND, the degenerative circuit nodes XD11 and XD12 are at different voltage values.

This voltage difference between the degenerative circuit nodes XD11 and XD12 causes a current passage through the parallel of the degenerative resistance Rdeg1 and the degenerative transistor MD1.

This current closes on the feedback transistors, MS11 and MS12, and the current of the first feedback transistor MS11 is mirrored by the output transistor MOUT1, ensuring a proper working of the circuit as a whole.

According to this embodiment of the disclosure, the driving circuit 10 therefore provides a gate driving voltage value Vtgc1 to be applied to the gate terminal of the degenerative driving transistor MD1 so as to obtain a transconductance variation of the differential cell 11 that is controllable and linear over time.

The driving circuit 10 may be used for driving, through the driving voltage Vtgc1 that is self-controlled thanks to the loop within the driving circuit 10 itself, a plurality of differential cells of a transconductance system.

In particular, in one embodiment the driving circuit 10 is connected to a large number of differential cells LNA, in standard applications even 2000-3000 cells. In order to ensure a proper driving of all the differential cells, a voltage buffer, in particular an operational amplifier (not shown as it is conventional) can be electrically coupled between the driving node XG1 and a connector to the differential transistor cells of the transconductance amplifiers to be driven in the transconductance system, so as to replicate the driving voltage Vtgc1 and not to add too large a load to the control loop being realized as indicated above.

Figures 7A, 7B:
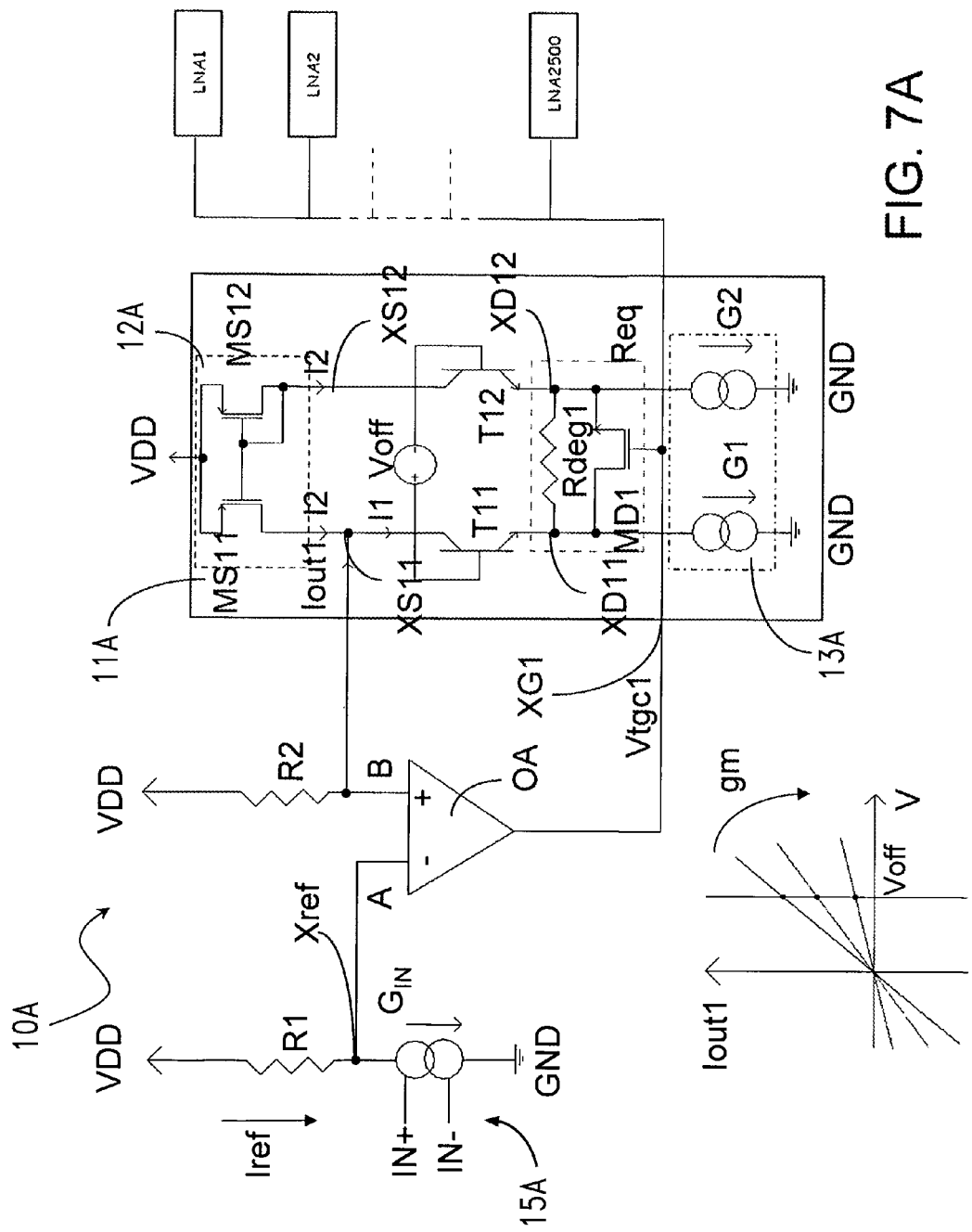
FIG. 7A schematically shows an alternative embodiment of the driving circuit according to the disclosure which controls a plurality of transconductance amplifiers.
FIG. 7B schematically shows the output current pattern of a copy differential cell of the driving circuit of FIG. 7A based on the offset voltage of the differential pair as the transconductance gain varies.

It is possible to implement the method according to the disclosure also by a driving circuit that is voltage controlled, as schematically shown in FIG. 7A.

In this case, the driving circuit 10A comprises an operational amplifier OA and is directly connected to a plurality of cells, in particular 2500 cells, LNA1 ... LNA2500, providing the driving voltage value Vtgc1 thereto.

As seen before for the embodiment shown in FIGS. 2, 3 and 5, the driving circuit 10A comprises a differential cell 11A which is substantially identical to the base structure of a transconductance amplifier that the driving circuit 10A is intended to drive. In particular, the differential cell 11A comprises the first T11 and the second transistor T12, in the example bipolar transistors, that are electrically coupled between a feedback block 12A, in turn connected to the first voltage reference terminal, in particular the terminal receiving the positive supply VDD, and a biasing block 13, in turn connected to a second voltage reference terminal, in particular a ground GND.

A voltage generator Voff is connected to the control terminals, or base, of the bipolar transistors T11 and T12 for offsetting the differential cell and obtaining a current signal Idiff.

As seen before, the first bipolar transistor T11 is electrically coupled between the first feedback circuit node XS11 and the first degenerative circuit node XD11, whereas the second bipolar transistor T12 is electrically coupled between the second feedback circuit node XS12 and the second degenerative circuit node XD12.

In particular, the feedback block 12A comprises the first feedback transistor MS11, which is electrically coupled between the first positive supply voltage reference VDD and the first feedback circuit node XS11 and has a control terminal, or gate, connected to a control terminal, or gate, of the second feedback transistor MS12, which is diode-connected and in turn electrically coupled between the first positive supply voltage reference VDD and the second feedback circuit node XS12.

Moreover, the biasing block 13A comprises a first G1 and a second biasing current generator G2, which are equal to each other, electrically coupled between the first XD11 and the second degenerative circuit node XD12, respectively, and ground GND.

As before, the differential cell 11A further comprises the degenerative resistance Rdeg1, electrically coupled between the first and second degenerative circuit nodes, XD11 and XD12, as well as the degenerative driving transistor MD1 that is electrically coupled in parallel with the degenerative resistance Rdeg1, between the first and second degenerative circuit nodes, XD11 and XD12, and has a control terminal, or gate, connected to the driving terminal XG1, and receiving therefrom a gate driving voltage Vtgc1.

According to this alternative embodiment, the driving circuit 10A further comprises the operational amplifier OA having an output terminal connected to the driving terminal XG1. The presence of this operational amplifier OA allows the direct driving of a plurality of differential transistor cells of the transconductance amplifiers to be driven.

The driving circuit 10 thus comprises a first resistive element R1 connected between the positive supply voltage reference VDD and the node Xref. An input current generator $G_{IN}$ is connected to the differential input terminals IN+ and IN− and is controlled by the voltage therein, with a function equivalent to the comparison block 15 of FIG. 5. The node Xref is connected to the output terminal of the current generator $G_{IN}$.

In this case, making the current of the input current generator $G_{IN}$ flow in the first resistive element R1 causes a reference voltage VA to be produced on node Xref and thus on a first input terminal A of the operational amplifier OA, allowing a voltage comparison.

In particular, a reference current Iref flows in the first resistive element R1 proportional to the differential voltage signal applied to the input terminals IN+ and IN−.

Moreover, the first resistive element R1 is connected to the first input terminal A, in particular an inverting one (−), of the operational amplifier OA, in turn having a second input terminal B, in particular a non-inventing one (+), connected by a second resistive element R2 to the positive supply voltage reference VDD. The second input terminal B of the operational amplifier OA is further connected to the first feedback circuit node XS11.

In one embodiment, the first and second resistive elements R1 and R2 are equal to each other.

It should be noted that the output current Iout1 from the differential cell 11A at the first feedback circuit node XS11 is proportional to the transconductance thereof, actually being a control parameter. In particular, the output current Iout1 is equal to the difference between a first current I1 that flows in the first bipolar transistor T11 and a second current I2 that flows in the second feedback transistor MS12 (coming from the second bipolar transistor T12), and thus in the first feedback transistor MS11 that is with this second feedback transistor MS12 in a mirror configuration.

Thanks to the second resistive element R2, such output current Iout1 generates a voltage value VB applied to the second input terminal B of the operational amplifier OA which, for its own virtual ground principle, tends to make it equal to the voltage value VA applied to the first input terminal A thereof, in turn obtained thanks to the current Iref.

In this way, changing the reference current Iref, the operational amplifier OA is offset, causing a variation of the driving voltage Vtgc1 on the output terminal thereof and as a consequence, the variation of the equivalent resistance Req of the differential cell 11A. In particular, a current Iref flows in this equivalent resistance Req equal to half the output current Iout1, according to Kirchhoff's law as applied to the first feedback circuit node XS11. In particular, since current I1 that runs through the first bipolar transistor T11 is equal to the biasing current Ibias provided by the first biasing current generator G1 added to the current Ireq that flows in the equivalent resistance Req (I1=Ibias+Ireq) and current I2 that runs through the second bipolar transistor T12 is equal to the biasing current Ibias provided by the second biasing current generator G2 (and equal to the biasing current Ibias provided by the first biasing current generator G1) decreased by the current Ireq that flows in the equivalent resistance Req (I2=Ibias−Ireq), in this first feedback circuit node XS11 there is:

$$Iout1+I2-I1=0, \text{ that is, } Iout1=Ibias+Ireq-Ibias+Ireq=2*Ireq.$$

Actually, the loop comprising the driving circuit 10A and the operational amplifier OA changes the transconductance of the differential cell 11A of the driving circuit 10A itself and as a consequence, the driving voltage value Vtgc1 to be applied to cells LNA1 . . . LNA2500 thanks to a final comparison in voltage and not in current, but in any case implementing a driving method according to one embodiment of the disclosure.

In particular, according to this alternative embodiment, the driving circuit 10A comprises a comparison block 15A connected to node Xref and realized by the input generator $G_{IN}$ connected to the differential input terminals IN+, IN− and controlled by the voltage therein.

Moreover, the comparison block 15A thus is related, through the operational amplifier OA and the resistive elements R1 and R2, to the first feedback circuit node XS11.

In this case, making a voltage comparison, the reference current VA is produced on node Xref, and thus on the first input terminal A of the operational amplifier OA, making the current provided by the input generator $G_{IN}$ flow in the first resistive element R1.

It should be noted that, as the offset voltage value Voff varies, it is possible to obtain a different output current Iout1 from the differential cell 11A of the driving circuit 10A, as shown in FIG. 7B. The value of the offset voltage Voff of the differential pair is established in the design step.

In conclusion, the driving methods according to the embodiments of the disclosure provide a driving voltage value capable of obtaining a transconductance variation that is controllable and linear over time. This driving voltage is self-controlled thanks to the loop within the driving circuit itself. In particular, the driving circuit provides a driving voltage capable of compensating the non-linear gain variations of the amplifier such driving circuit is connected to.

According to the embodiments of the disclosure, the driving circuit implementing such a method is capable of driving a plurality of transconductance cells in a transconductance system by using the controlled driving voltage obtained by a single loop, these cells even optionally being in a large number.

Obviously, a technician of the field, aiming at meeting incidental and specific needs, will bring several modifications to the above described driving method and circuit, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driving method, comprising:
   obtaining a linear gain variation of a transconductance amplifier that includes a first differential transistor cell having a degenerative driving transistor configured to be driven by a driving voltage, the obtaining including:
   generating an output current signal using a second differential transistor cell, said output current signal having a linear relationship with a transconductance value of said second differential cell as said driving voltage varies;
   generating a reference current signal having a linear relationship with a differential input voltage;
   comparing said output current signal and said reference current signal;
   adjusting a driving voltage value applied to a degenerative driving transistor of the transconductance amplifier; and
   modifying said transconductance value of said second differential transistor cell until said current signals are balanced.

2. The method according to claim 1, wherein generating the output current signal using said second differential transistor cell comprises offsetting a pair of transistors comprised in the second differential transistor cell.

3. The method according to claim 1, wherein the second differential transistor cell is substantially identical to the first differential transistor cell.

4. A transconductance system comprising:
   a transconductance amplifier that includes a first differential transistor cell; and
   a driving circuit that includes:
      a driving terminal;
      first and second voltage reference terminals;
      a feedback block coupled between the first voltage reference terminal and first and second feedback circuit nodes;
      a biasing block coupled between the second voltage reference terminal and first and second degenerative circuit nodes;
      a second differential transistor cell that includes a first transistor electrically coupled between the first feedback circuit node and the first degenerative circuit node, a second transistor electrically coupled between the second feedback circuit node and the second degenerative circuit node, a degenerative resistance electrically coupled between the first and second degenerative circuit nodes, and a degenerative driving transistor electrically coupled in parallel to the degenerative resistance between said degenerative circuit nodes, said degenerative driving transistor having a control terminal electrically coupled to the driving terminal; and
      a comparison block electrically coupled between said first and second voltage reference terminals and electrically coupled to said driving terminal, the comparison block being configured to receive an output current that is proportional to a transconductance value of the second differential transistor cell, and provide a controlled driving voltage cell on said driving terminal that is based on a comparison of the output current with a reference current.

5. The transconductance system according to claim 4, wherein said driving circuit further comprises an output transistor electrically coupled between said first voltage reference terminal and said driving terminal and connected to the feedback block, the output transistor being configured to provide the output current that is proportional to the transconductance value of the second differential transistor cell.

6. The transconductance system according to claim 5, wherein said feedback block comprises:
   a first feedback transistor electrically coupled between said first voltage reference node and said first feedback circuit node and having a control terminal electrically coupled to a control terminal of said output transistor; and
   a diode-connected second feedback transistor electrically coupled between said first voltage reference terminal and said second feedback circuit node.

7. The transconductance system according to claim 4, wherein said comparison block comprises:
   a differential pair of transistors electrically coupled between an internal biasing node and first and second internal mirror nodes, respectively, and having respective control terminals configured to receive differential inputs; and
   a plurality of mirror transistors respectively electrically coupled to said first and second internal mirror nodes and electrically coupled to said second voltage reference terminal.

8. The transconductance system according to claim 7, wherein said plurality of mirror transistors comprises:
   a diode-configured first mirror transistor electrically coupled between said second internal mirror node and said second voltage reference terminal, and having a control terminal electrically coupled to said second internal mirror node;
   a second mirror transistor electrically coupled between said driving terminal and said second voltage reference terminal, and having a control terminal electrically coupled to said control terminal of said first mirror transistor; and
   a diode-configured third mirror transistor electrically coupled between said first internal mirror node and said second voltage reference terminal, and having a control terminal electrically coupled to said first internal mirror node.

9. The transconductance system according to claim 8, wherein said comparison block further comprises a biasing transistor electrically coupled between said first voltage reference terminal and said internal biasing node and having a control terminal electrically coupled to a biasing terminal configured to receive a biasing voltage.

10. The transconductance system according to claim 4, wherein said first and second transistors of said second differential transistor cell are offset.

11. The transconductance system according to claim 10, further comprising:
    a third voltage reference terminal; and
    a voltage generator coupled to the third voltage reference terminal and configured to provide a constant voltage, wherein said first transistor has a control terminal electrically coupled to the third voltage reference terminal and said second transistor has a control terminal electrically coupled to the voltage generator and configured to receive the constant voltage, said first and second transistors of said second differential transistor cell being configured to be offset by the constant voltage.

12. The transconductance system according to claim 10, further comprising a third voltage reference terminal, wherein said first and second transistors of said second differential transistor cell have control terminals electrically coupled to the third voltage reference terminal and are offset in terms of area.

13. The transconductance system according to claim 4, wherein said biasing block comprises a first and a second biasing transistor respectively electrically coupled between said first and second degenerative circuit nodes and said second voltage reference terminal and having control terminals electrically coupled to one another and to a biasing terminal configured to receive a biasing voltage.

14. The transconductance system according to claim 4, wherein said comparison block comprises:
   an input current generator configured to be controlled by a differential input voltage and produce the reference current; and
   an operational amplifier having first and second input terminals respectively electrically coupled to the input current generator and the first feedback circuit node and an output terminal electrically coupled to said driving terminal.

15. The transconductance system according to claim 14, comparison block further comprises a first and a second resistive element electrically coupled between said first voltage reference terminal and the first and second input terminals of said operational amplifier.

16. The transconductance system according to claim 15, wherein said feedback block comprises:
   a first feedback transistor electrically coupled between said first voltage reference terminal and said first feedback circuit node and having a control terminal; and
   a diode-configured second feedback transistor electrically coupled between said first voltage reference terminal and the second feedback circuit node and having a control terminal electrically coupled to the control terminal of the first feedback transistor.

17. The transconductance system according to claim 16, wherein said biasing block comprises a first and a second biasing current generator electrically coupled between said first and second degenerative circuit nodes, respectively, and said second voltage reference terminal.

18. A driving circuit for driving a transconductance amplifier, the driving circuit comprising:
   a driving terminal;
   first and second voltage reference terminals;
   a feedback block coupled between the first voltage reference terminal and first and second feedback circuit nodes;
   a biasing block coupled between the second voltage reference terminal and first and second degenerative circuit nodes;
   a second differential transistor cell that includes a first transistor electrically coupled between the first feedback circuit node and the first degenerative circuit node, a second transistor electrically coupled between the second feedback circuit node and the second degenerative circuit node, a degenerative resistance electrically coupled between the first and second degenerative circuit nodes, and a degenerative driving transistor electrically coupled in parallel to the degenerative resistance between said degenerative circuit nodes, said degenerative driving transistor having a control terminal electrically coupled to the driving terminal; and
   a comparison block electrically coupled between said first and second voltage reference terminals and electrically coupled to said driving terminal, the comparison block being configured to receive an output current that is proportional to a transconductance value of the second differential transistor cell, and provide a controlled driving voltage cell on said driving terminal that is based on a comparison of the output current with a reference current.

19. The driving circuit according to claim 18, wherein said driving circuit further comprises an output transistor electrically coupled between said first voltage reference terminal and said driving terminal and connected to the feedback block, the output transistor being configured to provide the output current that is proportional to the transconductance value of the differential transistor cell.

20. The driving circuit according to claim 19, wherein said feedback block comprises:
   a first feedback transistor electrically coupled between said first voltage reference node and said first feedback circuit node and having a control terminal electrically coupled to a control terminal of said output transistor; and
   a diode-connected second feedback transistor electrically coupled between said first voltage reference terminal and said second feedback circuit node.

21. The driving circuit according to claim 18, wherein said comparison block comprises:
   a differential pair of transistors electrically coupled between an internal biasing node and first and second internal mirror nodes, respectively, and having respective control terminals configured to receive differential inputs; and
   a plurality of mirror transistors respectively electrically coupled to said first and second internal mirror nodes and electrically coupled to said second voltage reference terminal.

22. The driving circuit according to claim 21, wherein said plurality of mirror transistors comprises:
   a diode-configured first mirror transistor electrically coupled between said second internal mirror node and said second voltage reference terminal, and having a control terminal electrically coupled to said second internal mirror node;
   a second mirror transistor electrically coupled between said driving terminal and said second voltage reference terminal, and having a control terminal electrically coupled to said control terminal of said first mirror transistor; and
   a diode-configured third mirror transistor electrically coupled between said first internal mirror node and said second voltage reference terminal, and having a control terminal electrically coupled to said first internal mirror node.

23. The driving circuit according to claim 22, wherein said comparison block further comprises a biasing transistor electrically coupled between said first voltage reference terminal and said internal biasing node and having a control terminal electrically coupled to a biasing terminal configured to receive a biasing voltage.

24. The driving circuit according to claim 18, wherein said comparison block comprises:
   an input current generator configured to be controlled by a differential input voltage and produce the reference current; and
   an operational amplifier having first and second input terminals respectively electrically coupled to the input current generator and the first feedback circuit node and an output terminal electrically coupled to said driving terminal.

25. The driving circuit according to claim 24, comparison block further comprises a first and a second resistive element electrically coupled between said first voltage reference terminal and the first and second input terminals of said operational amplifier.

\* \* \* \* \*

UNITED STATES PATENT AND TRADEMARK OFFICE
CERTIFICATE OF CORRECTION

PATENT NO. : 8,629,720 B2
APPLICATION NO. : 13/482714
DATED : January 14, 2014
INVENTOR(S) : Matteo Albertini et al.

Page 1 of 1

It is certified that error appears in the above-identified patent and that said Letters Patent is hereby corrected as shown below:

On the Title Page

Item (30):
"Nov. 20, 2009 (IT)......MI2009A002108" should read, --Nov. 30, 2009 (IT)......MI2009A002108--

Signed and Sealed this
Twenty-ninth Day of April, 2014

Michelle K. Lee
*Deputy Director of the United States Patent and Trademark Office*